US006921982B2

United States Patent
Joshi et al.

(10) Patent No.: US 6,921,982 B2
(45) Date of Patent: Jul. 26, 2005

(54) FET CHANNEL HAVING A STRAINED LATTICE STRUCTURE ALONG MULTIPLE SURFACES

(75) Inventors: Rajiv V Joshi, Yorktown Heights, NY (US); Richard Q Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/626,760

(22) Filed: Jul. 21, 2003

(65) Prior Publication Data

US 2005/0017377 A1 Jan. 27, 2005

(51) Int. Cl.$^7$ .............................................. H01L 27/11
(52) U.S. Cl. ...................... 257/903; 257/903; 257/349
(58) Field of Search ................................. 257/903, 349, 257/192, 506, 19, 15, 18, 20

(56) References Cited

U.S. PATENT DOCUMENTS

| | | | |
|---|---|---|---|
| 5,534,713 A | 7/1996 | Ismail et al. | 257/24 |
| 5,759,898 A | 6/1998 | Ek et al. | 438/291 |
| 6,252,284 B1 | 6/2001 | Muller et al. | 257/412 |
| 6,300,182 B1 * | 10/2001 | Yu | 438/217 |
| 6,432,829 B2 | 8/2002 | Muller et al. | 438/694 |
| 6,635,909 B2 * | 10/2003 | Clark et al. | 257/192 |
| 6,765,303 B1 * | 7/2004 | Krivokapic et al. | 257/25 |
| 6,774,390 B2 * | 8/2004 | Sugiyama et al. | 257/19 |
| 6,803,631 B2 * | 10/2004 | Dakshina-Murthy et al. | 257/349 |

OTHER PUBLICATIONS

IEEE Transactions on Electron Devices, "Electron and Hole Mobility Enhancement in Strained SOI by Wafter Bonding", Huang et al., vol. 49, No. 9, Sep. 2002.
IBM Journal Research & Development, "Process requirements for continued scaling of CMOS–the need and prospects for atomic–level manipulation", P.D. Agnello, vol. 46, No. 2/3, Mar./May 2002.
"The Amazing Vanishing Transistor Act", Geppert, Linda, http://www.spectrum.ieee.org/WEBONLY/publicfeature/oct02/nano.html.

* cited by examiner

*Primary Examiner*—David Nelms
*Assistant Examiner*—Thinh T Nguyen
(74) *Attorney, Agent, or Firm*—Satheesh K. Karra, Esq.; Harrington & Smith, LLP

(57) ABSTRACT

A channel 16 of a FinFET 10 has a channel core 24 and a channel envelope 32, each made from a semiconductor material defining a different lattice structure to exploit strained silicon properties. A gate is coupled to the channel envelope through a gate dielectric. Exemplary materials are Si and $Si_xGe_{1-x}$, wherein 78<x<92. The channel core 24 has a top surface 26 of width $w_c$ and an upstanding surface 28, 30 of height $h_c$, preferably oriented 90° to one another. The channel envelope 32 is in contact with the top 26 and upstanding surfaces 28, 30 so that the area of interface is increased as compared to contact only along the top surface 26, improving electrical conductivity and gate 18 control over the channel 16. The height $h_c$ can be tailored to enable a smaller scale FET 10 within a stabilized SRAM. Various methods of making the channel 16 are disclosed, including a mask and etch method, a handle wafer/carrier wafer method, and a shallow trench method. Embodiments and methods for FinFETs with one to four gates are disclosed.

23 Claims, 9 Drawing Sheets

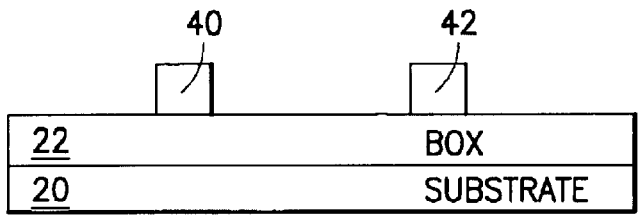
FIG.5a
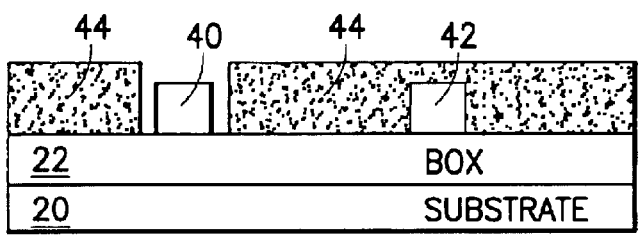
FIG.5b
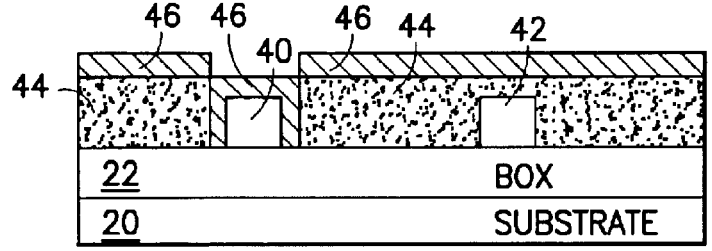
FIG.5c
FIG.5d
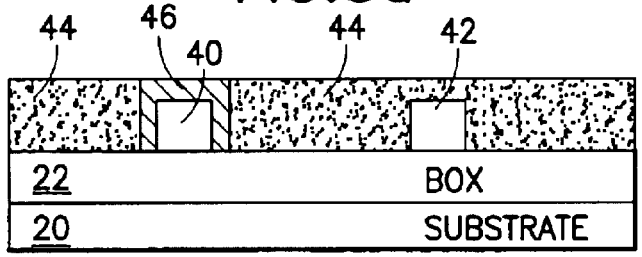
FIG.5e
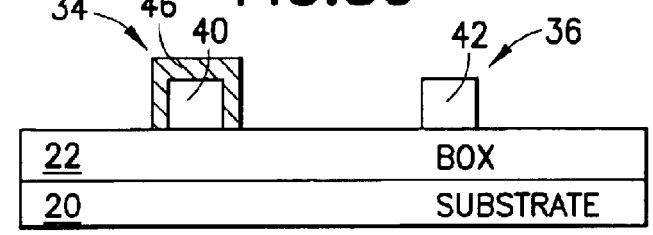
FIG.5f

US 6,921,982 B2

FET CHANNEL HAVING A STRAINED LATTICE STRUCTURE ALONG MULTIPLE SURFACES

TECHNICAL FIELD

These teachings relate generally to field effect transistors (FET) disposed on a semiconductor wafer or chip, in particular, to a layered structure as a channel that connects a source and a drain of a FET, wherein one of the layers is characterized by a strained lattice structure.

BACKGROUND OF THE INVENTION

Semiconductors and integrated circuit chips have become ubiquitous within many products due to their continually decreasing cost and size. Miniaturization in general allows increased performance (more processing per clock cycle and less heat generated) at lower power levels and lower cost. Present technology is at or approaching atomic-level scaling of certain micro-devices such as logic gates, FETs, capacitors, etc. Circuit chips with hundreds of millions of such devices are not uncommon. Further size reductions appear to be approaching the physical limit of trace lines and micro-devices that are embedded upon and within their semiconductor substrates. The present invention is directed to such micro-sized FET devices. A FET is a transistor consisting of a source, a gate, and a drain. The action of the FET depends on the flow of majority carriers along a channel between the source and drain that runs past the gate. Current through the channel, which is between the source and drain, is controlled by the transverse electric field under the gate. More than one gate may be used to more effectively control the channel. The length of the gate determines how fast the FET switches and how fast the circuit can operate, and is generally about the same as the length of the channel (i.e., the distance between the source and drain). State of the art gate lengths are today on the order of 50 nm, and are moving toward 10 nm within the next decade. Such size reductions should enable upwards of a billion devices on a single chip. However, such small scaling necessitates greater control over performance issues such as short channel effects, punch-through, and MOS leakage current.

Recently, the size of FETs has been successfully reduced through the use of one or more fin-shaped channels, known as fins. FETs employing fins are known as FinFETs. Previously, complementary metal-oxide semiconductor (CMOS) devices were substantially planar along the surface of the semiconductor substrate, the exception being the FET gate that was disposed over the top of the channel. Fins break from that paradigm by using a vertical structure in order to maximize surface area of the channel that is exposed to the gate. The gate controls the channel more strongly because it extends over three sides of the fin shaped channel, rather than only across the top of a more traditional planar channel. An example of a FinFET is shown in FIG. 1, which is a TEM micrograph of a prior art FET with six fins. Each pair of fins comprises an NFET and a PFET.

One method to enhance fin performance is to fabricate fins in layers of disparate materials. One such exemplary device assigned to the assignee of this invention is described in U.S. Pat. No. 6,252,284 B1, "Planarized Silicon Fin Device", which is directed to controlling short-channel effects.

Often, one of the layers of a multi-layered planarized FET fin is strained silicon. It has been previously discovered that biaxially stretching the crystalline lattice structure of silicon can speed the flow of electrons through a transistor, thereby enhancing performance and decreasing power consumption. There is a natural tendency of atoms in layers of disparate materials to align with one another by stretching and/or compressing their mismatched lattice structures along a planar interface of the mismatch. Varying the respective thickness and chemical composition of the materials aids in controlling the extent of extension and compression in either material. As an example, FIG. 2a depicts a silicon lattice structure and a germanium lattice structure, not to scale, in their natural (unstretched) states. When silicon is disposed (or grown) on a thicker layer of germanium, as in the SiGe compound of FIG. 2b, the lattice of silicon stretches while the lattice of germanium remains substantially unchanged, resulting in strained silicon.

This result is achieved as the comparatively greater thickness of the germanium layer yields greater structural integrity and greater resistance to lattice compression. The actual process of lattice stretching may also, or alternatively, entail atoms of Si and Ge intermixed within a lattice structure. This integrates both atoms within a single layer, wherein the larger Ge atoms force the integrated lattice structure to stretch, as compared to a natural (unstretched) silicon lattice structure. The opposite effect from that shown in FIG. 2b can also be realized, wherein a thinner layer of germanium exhibits lattice compression when bonded to a thicker layer of silicon. Strained silicon has been shown to enhance electron/hole mobility by up to 70% in NFETs, and up to 30% in PFETs. Other materials such as silicon germanium carbon may be used to form the crystalline heterojunction that enhances conductivity. There are several methods used to form strained layers, including chemical vapor deposition (CVD) and molecular beam epitaxy (MBE).

Strained silicon disposed along a plane has been used in prior art FinFETs. However, current leakage continues to be a limiting factor in further scaling of FETs toward the atomic limit. Current leakage becomes an ascendant concern as miniaturization progresses because shorter length FET gates, which generally track the channel length, have less ability to control electric charge carriers (holes or electrons).

The unintentional flow of charge carriers when the transistor is off is termed "current leakage." Current leakage is the primary source of power consumed by an idle transistor. Current leakage may be classified into two types: MOS off current, wherein an unintended current passes through the channel despite the gate attempting to shut off current completely; and gate tunneling leakage current, wherein unintended current follows a parasitic pathway flowing into the channel, diffusions, or silicon body. As FET channel lengths continue to decrease, it is expected that gate tunneling leakage current will become a predominant concern for designers. The fin structure enhances gate control over the channel, but gate control over current is not absolute, even in prior art FinFETs. Compounding the current leakage problem, miniaturization enables ever-lower power levels that require more absolute gate control. Current leakage that escapes the gate's control is less distinguishable from intentional current, particularly at low current levels.

What is needed is a FET that allows small scaling with enhanced performance for both NFETs and PFETs. Preferably, the FET should improve gate control in a fin structure that exhibits enhanced carrier transport properties.

SUMMARY OF THE PREFERRED EMBODIMENTS

The foregoing and other problems are overcome, and other advantages are realized, in accordance with the presently preferred embodiments of these teachings. The present invention concerns a channel for electrically connecting a source and a drain of a field effect transistor (FET), commonly called a fin for a FinFET. The channel includes a channel core and a channel envelope. The channel core is coupled to a substrate such as a SIMOX wafer (a wafer with an upper region separated by implanted oxygen) or bonded wafer. The channel core defines a top surface that is spaced from the substrate, and opposed sidewall surfaces between the substrate and the top surface. The channel core is formed from a first semiconductor material defining a first lattice structure.

The channel envelope is in contact with the opposed sidewall surfaces and the top surface of the channel core. The channel envelope is formed from a second semiconductor material defining a second lattice structure that differs from the first lattice structure. This difference in lattice structure provides enhanced electrical conductivity due to stretching or compressing of the lattice structure. Preferably, the two materials are silicon and a silicon-germanium compound.

In another aspect of the present invention, the channel core defines a top and an adjoining side surface. In a preferred embodiment, the top surface is the horizontal top and the side surface is one of two upstanding sidewalls of the channel core, although two upstanding surfaces extending from the substrate and meeting at a peak, or two sidewalls joined by a third lateral surface may be used. The channel core comprises a first semiconductor material and the channel envelope comprises a second semiconductor material that differs from the first. At least one of the first or second semiconductor materials exhibits enhanced electrical conductivity due to one of a stretched or compressed lattice structure. The channel envelope is in contact with both the top and side surfaces, providing a larger area of interface between the disparate lattice materials, as compared to prior art channels that provide interface only along a top surface. The exemplary materials noted above are operable to provide the stretched or compressed lattice structure.

The present invention also includes methods of making a FET channel. In one such method, a substrate is provided with an overlying layer of a first semiconductor material. A first channel core is defined from the overlying layer, such as by a mask and etch technique. The channel core defines a top surface spaced from the substrate and opposed first and second sidewalls between the substrate and the top surface. The method further includes disposing a layer of second semiconductor material to contact at least two of the surfaces (that is, at least two of the top surface, the first sidewall and the second sidewall). Electrical conductivity through the layer of second semiconductor material, which is different from the first, is enhanced by its contact with the channel core. The layer of second semiconductor material may be deposited via vacuum deposition, or may be grown on a carrier wafer and separated therefrom to contact the appropriate surfaces of the channel core.

Another method of forming the channel includes providing a first layer of a semiconductor material over a substrate. This method includes defining a trench in the overlayer, and the overlayer is then divided into a first section and a second section by the trench. The trench may be filled with a buffer material such as TEOS (also known as tetraethoxysilane, tetraethylorthosilicate, tetraethelorthosilicate, and tetrethoxysilicide). A portion of the second section is then removed to leave a remaining layer of first semiconductor material that has a thickness less than a depth of the trench. This exposes a portion of the trench. The method then includes disposing a layer of a second semiconductor material over the remaining layer and adjacent to the trench. Exemplary semiconductor materials are discussed above. Preferably, the remaining layer is less than about 15 nm. Where the second semiconductor material is $Si_xGe_{1-x}$, the relative concentration of germanium may be chosen to promote thermal stability of the channel. Preferably, the germanium content is between about 8% and about 22%, and most preferably between about 10% and about 20%, and a low temperature chemical vapor deposition process is used to form the layer of second semi-conductor material.

Further, disclosed herein is a channel for electrically connecting a source and a drain of a field effect transistor (FET) comprising: a channel core comprising a bottom surface coupled to a substrate and defining a top surface spaced from the substrate and opposed sidewall surfaces between the bottom surface and the top surface, wherein the channel core is formed from a first semiconductor material defining a first lattice structure; and a channel envelope in contact with at least one of the top surface, the bottom surface and one of the sidewall surfaces (or combinations thereof), wherein the channel envelope comprises a second semiconductor material comprising a strained lattice structure that differs from the first lattice structure, the channel envelope being electrically coupled to a gate electrode. Preferably, the channel is formed of a relaxed Si—Ge lattice, and the envelope is formed of a strained Si lattice.

An exemplary circuit SRAM circuit using FinFET in accordance with the teachings herein is disclosed.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein:

FIGS. 5a–5f, collectively referred to as FIG. 5, are enlarged cross sectional views depicting one method of making a channel according to the present invention, using masking and etching to deposit a channel envelope onto a channel core;

DETAILED DESCRIPTION OF THE PREFERRED EMBODIMENTS

Figure 1:
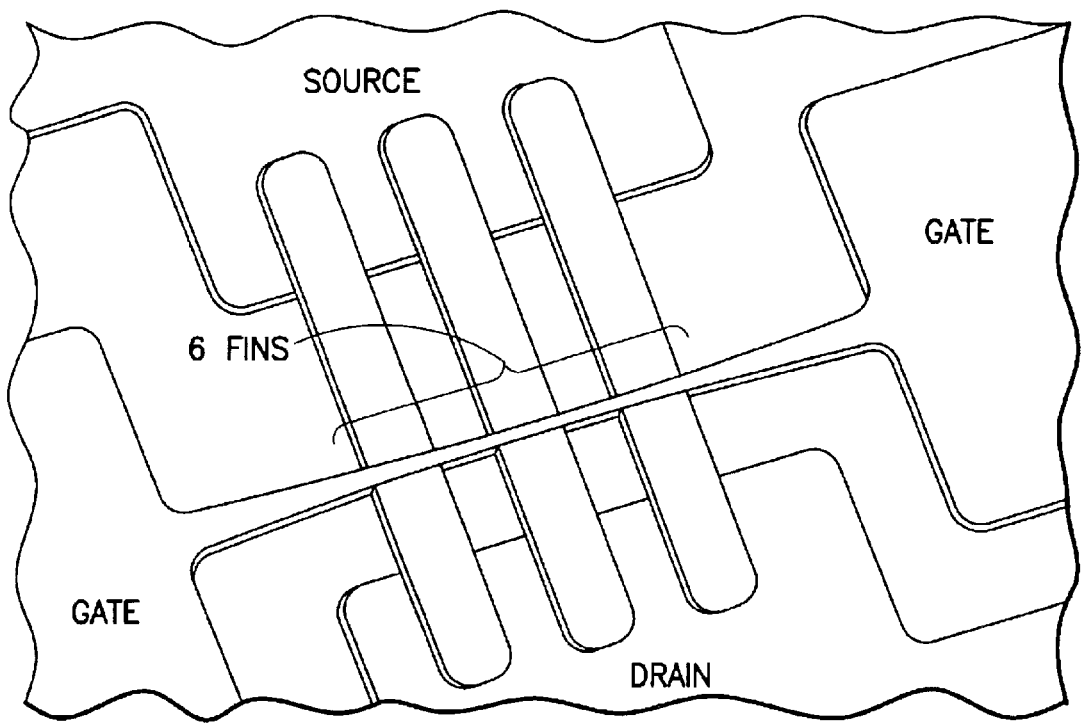
FIG. 1 is a TEM micrograph of a prior art FET with six fins.
Figure 2A:
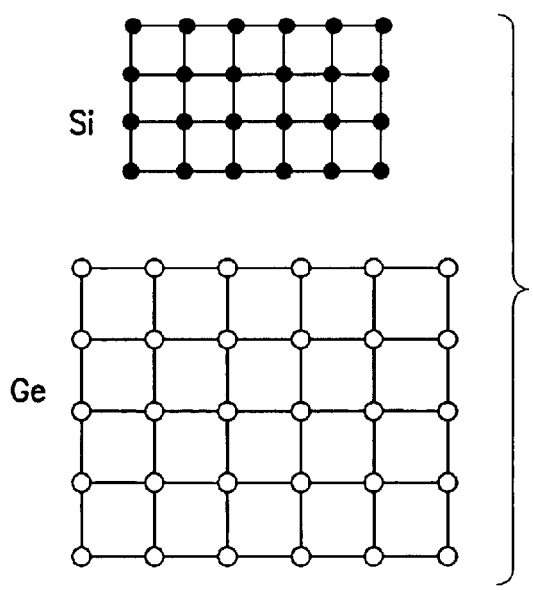
FIGS. 2a and 2b, collectively referred to as FIG. 2, are prior art diagrams showing how the lattice structure of silicon is strained when disposed adjacent to germanium (FIG. 2b) as opposed to its natural state (FIG. 2a)
Figure 2B:
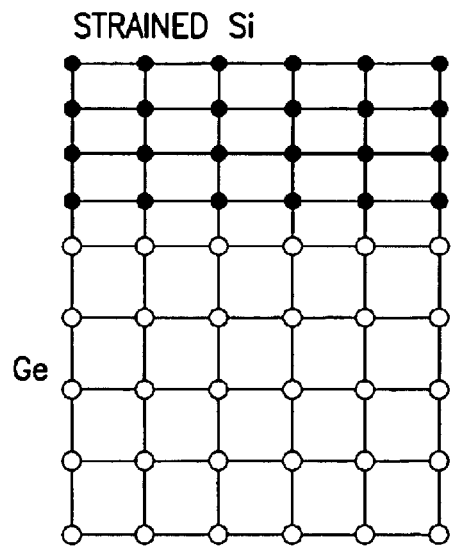
Figure 3:
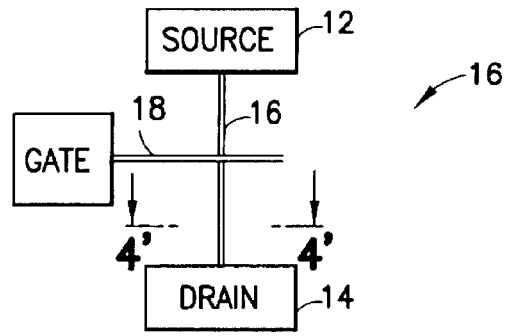
FIG. 3 is a block diagram depicting a FinFET in which the present invention may be disposed.

FIGS. 1 and 2a14 2b are described above and serve as context for understanding the present invention. FIG. 3 depicts in block diagram a FET 10. As known in the art, a source 12 and drain 14 are connected electrically via a channel 16, which is crossed by a gate 18. One or more channels 16 and gates 18 may be present in a single FET 10. As used herein, the length of the channel 16 is the distance from the source 12 to the drain 14 as depicted in FIG. 3.

Figure 4:
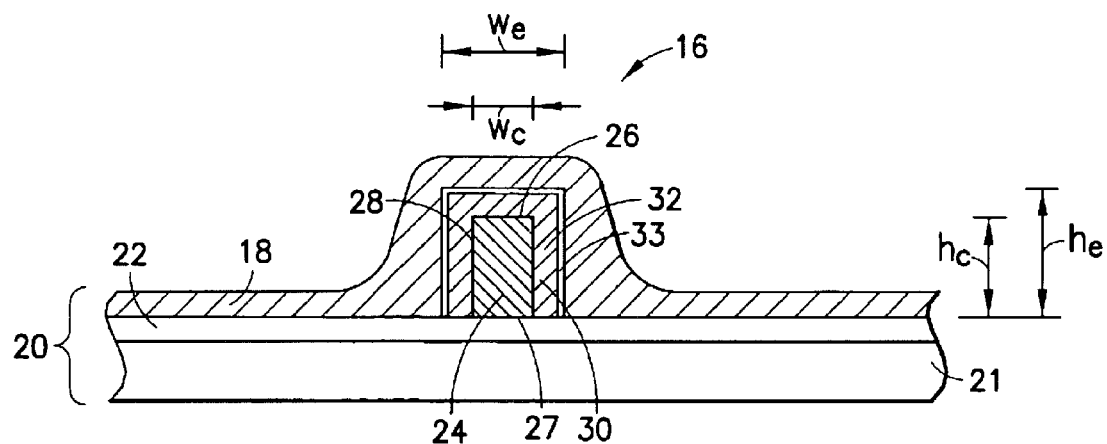
FIG. 4 is a sectional view of FIG. 3 along section lines 4'—4'.

A sectional view of the channel 16 at section line 4'—4' is depicted at FIG. 4. The FET 10 is disposed on a substrate 20 such as silicon 21 overlain with a layer of buried oxide 22. A channel core 24 is made from a first semiconductor material disposed over the substrate 20. The substrate 20 is preferably silicon based, such as a SIMOX wafer, a bonded wafer, or CZ silicon (silicon wafer from the Czochralski process) as known in the art. Preferably, the channel core 24 is formed atop the buried oxide layer 22 that forms part of the substrate 20. The channel core 24 defines a bottom surface 27 (shown as attached to the substrate 20), a top surface 26 spaced from the substrate 20 and opposed sidewalls 28, 30 disposed between the substrate 20 and the top surface 26. The first semiconductor material from which the channel core 24 is made defines a first natural crystalline lattice structure. As used herein, unless specifically noted otherwise, a natural lattice structure for a particular material (element or compound) refers to the lattice structure of the particular material in question in its natural state, that is, without having been stretched, compressed, or otherwise strained by external manipulation such as was previously described for strained silicon. A compound exhibiting a relaxed lattice structure, wherein the relaxation is due only to annealing or other processing that purposefully removes tensile or compressive forces that would otherwise be present, is not considered herein to be the natural state lattice structure.

A channel envelope 32 is disposed to substantially cover that portion of the channel core 24 that is not in direct contact with the substrate 20 when the channel 16 is viewed in cross section, at least at the portion of the channel 16 crossed by the gate 18. Preferably, the channel envelope 32 is coupled to the top surface 26 and both opposed sidewalls 28, 30 of the channel core 24. The channel envelope 32 is formed from a second semiconductor material that defines a second natural crystalline lattice structure that differs from the first lattice structure. The different natural lattice structures of the first and second semiconductor materials cause either tensile or compressive stresses at least at the boundary of the channel core 24 and the channel envelope 32. This mismatch of natural lattices, herein termed a "heterojunction," facilitates carrier transport where the gate dielectric contacts the heterojunction stack. However, carrier transport is not necessarily maximized at the heterojunction; the main channel for carrier transport may alternately form within one or the other disparate materials, as known in the art, depending upon several factors. The channel core 24 defines a core width $w_c$ and a core height $h_c$. Similarly, the channel envelope 32 defines an envelope width $w_e$ and an envelope height $h_e$. Any, or all, of these dimensions may be selected to optimize or otherwise control the combined surface area of the opposed sidewalls 28, 30 and the top surface 26. Where the channel core 24 and/or envelope 32 are not rectangular shaped (as primarily illustrated herein), such as when the channel core 24 is triangular and the channel envelope 32 is disposed over two sides of the channel core 24, the width and height are deemed to be averages for the particular component. Threshold voltage of a FET 10 using the inventive channel 16 described herein can be selected based on the particular materials of either or both of the first and second semiconductor materials, the presence of a dopant in one or the other, or the core 24 and envelope 32 dimensions.

Preferably for a PFET, the first semiconductor material that comprises the channel core 24 is silicon, and the second semiconductor material that comprises the channel envelope 32 is a compound comprising silicon and germanium, such as $Si_{0.7}Ge_{0.3}$. For a NFET, the first semiconductor material that comprises the channel core 24 is preferably a compound comprising silicon and germanium that is processed to exhibit a relaxed lattice structure, and the second semiconductor material that comprises the channel envelope 32 is preferably silicon.

The gate 18, which may be formed of poly or metal or other material as known in the art, is disposed over the channel 16 so as to contact the channel envelope 32 through a dielectric layer 33, also termed a gate dielectric, disposed about the channel envelope 32. The dielectric layer 33 may include an oxide, oxynitride, or rare earth oxide (e.g., hafnium oxide). The channel envelope 32 is disposed so as to prevent substantial, and preferably complete, contact between the gate 18 and the channel core 24.

FIG. 5 illustrates a preferred method for making a FET 10 in accordance with the teachings herein. FIGS. 5a–f depict one embodiment, wherein both a PFET channel 34 and a NFET channel 36 are disposed on a single substrate 20.

In FIG. 5a, a substrate 20 including a buried oxide layer (BOX) 22 is provided and overlain with a layer of a first semiconductor material 38, such as silicon. The combination of substrate layer 20, BOX layer 22, and layer of first semiconductor material 38 may be provided by a SIMOX wafer, may be a bonded wafer, or may be provided by a Czochralski process as known in the art. In FIG. 5b, a first channel core 40 and a second channel core 42 are defined from the layer of first semiconductor material 38 by masking and etching, or by other means known in the art. The length and/or width of the first channel core 40 may differ from that of the second channel core 42. FIG. 5c depicts a mask 44 (two masks shown) over the second channel core 42 and over all areas except the immediate vicinity of the first channel core 40. Etching or other known processes may be used to remove the mask 44 from contact with opposed sidewall surfaces of the first channel core 40, or to prevent the mask 44 from ever contacting such sidewalls. The first channel core 40 will become the PFET channel 34.

FIG. 5d depicts deposition of a layer of second semiconductor material 46 over the entire wafer. Preferably, the layer of second semiconductor material 46 is a compound of Si and Ge that is deposited via ultra-high vacuum chemical vapor deposition (UHVCVD), but other chemical deposition processes are also compatible. Most preferably, the layer 46 defines a thickness in the range of 5–10 nm, and the thickness of the layer 46 is determined by the concentration of germanium and criterion related to layer thermal stability for such germanium concentration. The entity of FIG. 5d is planarized in FIG. 5e to remove that portion of the entire layer of second semiconductor material 46 that overlies the mask 44. The remainder of the mask 44 is removed in FIG. 5f; leaving the PFET channel 34 and the adjacent NFET channel 36. More recently developed methods deposit SiGe selectively on silicon. Using such a technique, a SiGe layer 46 can be selectively deposited on an exposed silicon channel core 40 and any residual removed via a chemical etch. Where the layer of first semiconductor material 38 is silicon and the layer of second semiconductor material 46 is $Si_xGe_{1-x}$, the channel envelope 32 formed by the $Si_xGe_{1-x}$ compound is under compressive stress due to the smaller natural lattice structure of the underlying Si layer 38.

An alternative method is depicted in FIG. 6. In FIG. 6a, a handle wafer 48 includes a buried oxide layer 22 as previously described, and an overlying layer of first semiconductor material 38, such as silicon. FIG. 6b depicts use of masking and etching to define to define one or more trenches 47 adjacent to a remaining portion 38a of the layer of first semiconductor material 38. Considering the entire expanse of the handle wafer 48, the trenches 47 and/or the remaining portions 38a of the layer of first semiconductor material 38 may or may not be contiguous. Parallel to, or at a separate time from, the processing depicted in FIGS. 6a–6b, a separate carrier wafer 50 is overlain with a layer of second semiconductor material 46, such as strained or relaxed SiGe, in FIG. 6c. The carrier wafer 50 with overlayer 46 is then subjected to ion implantation at FIG. 6c. As known in the art, implantation with ions 52 such as hydrogen or boron ions allows the overlayer 46 to be annealed and separated from the carrier wafer 50 at a temperature generally less than about 600° C., while also providing high quality SiGe free from dislocations. Nearly complete (≧95%) strain relaxation of the SiGe layer 46 can also be achieved. The above process is generally known in the art as a "smart-cut" technique, and is more particularly described by Lijuan Huang et al, ELECTRON AND HOLE MOBILITY ENHANCEMENT IN STRAINED SOI BY WAFER BONDING, *IEEE Transactions on Electron Devices.*, vol. 49, no. 9, September 2002, pp 1566–1571, herein incorporated by reference. At FIG. 6d, masking and etching are used to define one or more islands 49 from the second layer of semiconductor material 46. The shapes of the islands 49 on the carrier wafer 50 are complementary to the shapes of the trenches 47 on the handle wafer 48. Preferably, a thin oxide layer 51 is disposed over at least the islands 49 to facilitate later bonding to the handle wafer 48. Once the islands 49 are formed, further processing may be according to known finfet processing techniques, such as, for example, sidewall image transfer.

Figure 6A:
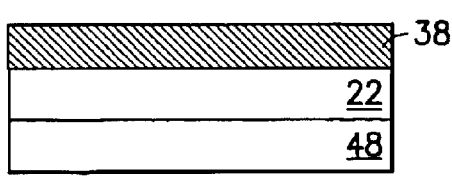
FIGS. 6a–6h, collectively referred to as FIG. 6, are enlarged cross sectional views depicting an alternative method of making at least one channel using a carrier wafer and a handle wafer.
Figure 6C:
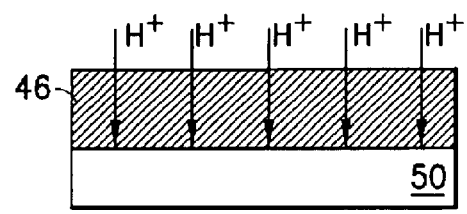
Figure 6B:
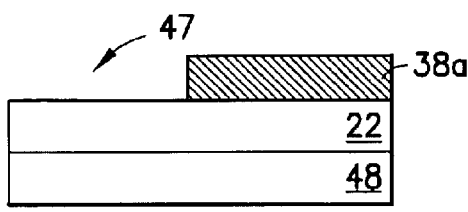
Figure 6D:
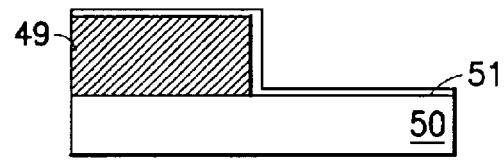
Figure 6E:
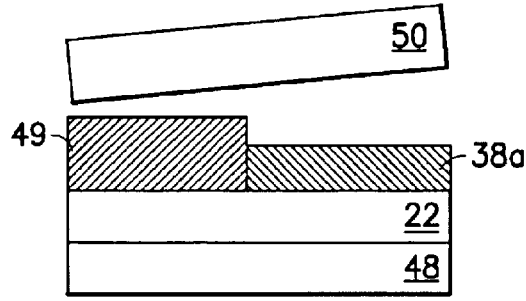

FIG. 6e depicts the structure of FIG. 6d brought together with the structure of FIG. 6b. In FIG. 6e, wherein the carrier wafer 50 is inverted over the handle wafer 48. The islands 49 and trenches 47 are precision aligned with one another, preferably accurate to within 0.25 microns. The anneal process described above for the smart-cut technique is employed to remove the islands 49 from the carrier wafer 50. The islands 49 then lie within the trenches 47, and are bonded to the handle wafer 48 by the thin oxide layer 51. The carrier wafer 50 is removed, preferably for later reuse as a handle wafer after a high temperature anneal and polishing. In some embodiments, vertical etches through the overlayer 46 and selective ion implantation bounded by those vertical etches is used to combine more than one layer (more than one type of semiconductor material) into an island 49. Such an island 49 may be disposed to match a recessed trench 47 on the handle wafer 48 as previously described, or it may be deposited on an elevated surface of silicon or other semiconductor material on the handle wafer 48. These embodiments result in a heterojunction of more than two layers, as described more fully below.

Figure 6F:
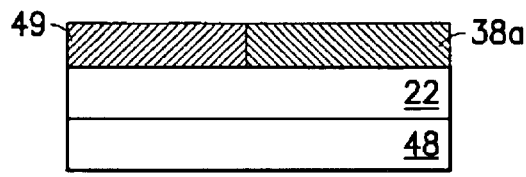

FIG. 6f shows smoothing of the exposed surfaces of the islands 49 and of the remaining portions 38a, where these surfaces are opposite the handle wafer 48. Smoothing and polishing is used to achieve a substantially uniform height.

Figure 6G:
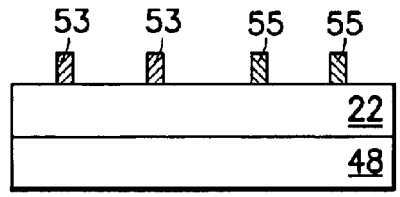
Figure 6H:
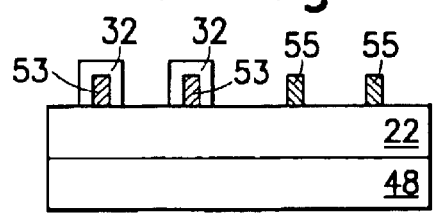
Figure 7A:
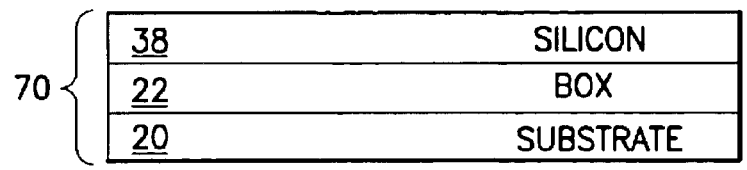
FIGS. 7a–7f, collectively referred to as FIG. 7, are enlarged cross sectional views depicting an alternative method of making a channel for a PFET using a shallow trench.
Figure 7B:
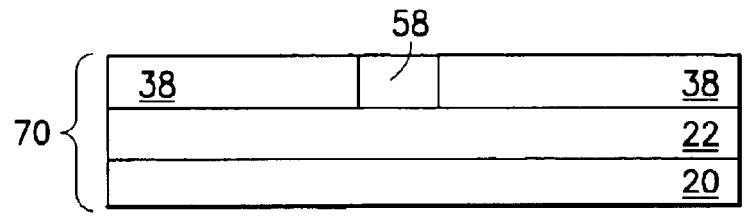
Figure 7C:
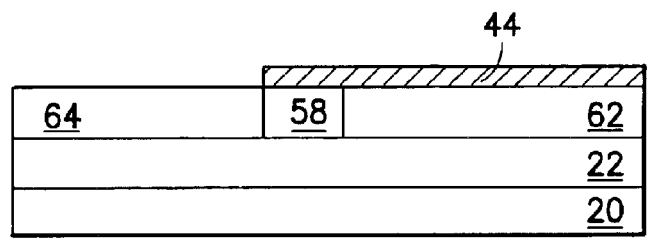
Figure 7D:
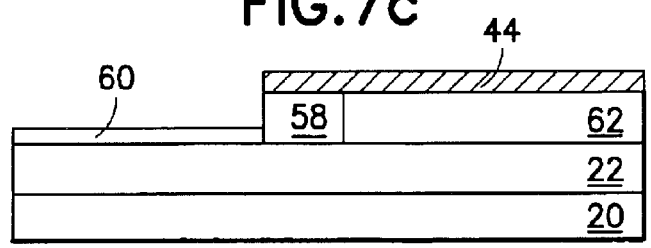
Figure 7E:
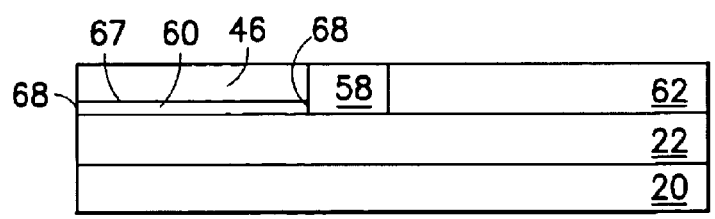
Figure 7F:
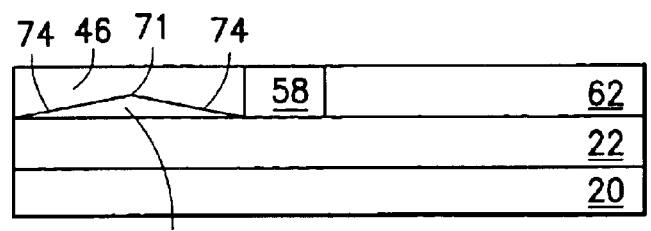

FIG. 6g depicts a step wherein both the island 49 and the remainder 38a are masked and etched, or otherwise processed, to define one or more PFET channel cores 53 and preferably also one or more NFET channel cores 55. While it is preferable to fabricate the PFET and NFET channels simultaneously as described herein, the present invention does not so require. As shown in FIG. 6h, an epitaxial layer of a semiconductor material different from the first semiconductor material is grown or disposed on the PFET channel cores 53 to form channel envelopes 32, creating a strained silicon or other hetero-layer.

The material of the channel envelope 32 may be strained or unstrained, depending upon the desired properties of the resultant channel 16. Maximum lattice discontinuity occurs along the lines defined by either of the opposed sidewall surfaces 28, 30 and the bottom surface 27/top surface 26 of the channel core 24.

Preferably, the PFET channel 34 or NFET channel 36 are characterized by a width of about 100–150 Å and a height of about 500–600 Å. These dimensions may change with scaling. Preferably, the strained lattice is disposed along both the sidewalls 28, 30 and the top 26 of the PFET channel 34 or NFET channel 36.

One particular application in which the carrier pathway along the strained sidewall can be exploited is in a FET 10 in a static random access memory (SRAM). SRAM is a type of memory that does not need to be refreshed like dynamic RAM (DRAM), so SRAM is generally much faster (typically about 10 ns for SRAM versus about 60 ns for DRAM) and more reliable. In addition, the cycle time (a measurement of how quickly two back-to-back accesses of a memory chip can be made) of SRAM is much shorter than that of DRAM because it does not need to pause between accesses. The design of SRAMs generally assumes FETs in several fixed sizes (quantized). However, the width of the channel 16 is critical for stability in SRAM, and thereby imposes a tradeoff between size and stability. Rather than select a FET with a quantized channel width that may be larger in the x-y plane (the plane of FIG. 3) than desirable, a FET 10 employing a fin according to the present invention may be used to modulate the height of the channel to enable a smaller FET 10 that still ensures SRAM stability. During fabrication, the starting silicon would be at least as high as the highest estimated fin. Selective masking and etching of certain devices within a cell tailors fin height to achieve the desired SRAM stability. Preferably, a slow etch is used to ensure uniformity and fine control over fin height. Additionally, effective channel width can be adjusted by using multiple fins, preferably in a side-by-side relation.

FIG. 7 is a series of block diagrams showing process steps in forming a PFET. FIG. 7 depicts a shallow trench isolation (STI) that is imposed between a first semiconductor material, such as SiGe, and a second semiconductor material, such as Si. At FIG. 7a, a substrate 20 supports a buried oxide layer (BOX) 22, which is overlain with a layer of a first semiconductor material 38, such as silicon. The substrate/BOX/overlayer combination 70 may be a SIMOX wafer, a bonded wafer, or a CZ wafer as previously described and known in the art. At FIG. 7b, a trench 58 is formed and filled with an oxide or other insulator such as TEOS, as is known in the art. It is noted that the trenching and filling represented by FIG. 7b is performed in several steps, and the trench 58 divides the layer of first semiconductor material 38 into a first region 62 and a PFET region 64. Alternatively, the trench 58 may be etched, but not filled, without departing from the advantages of the present invention. At FIG. 7c, a mask layer 44 is selectively disposed over the trench 58 and the first region 62 of the first semiconductor material. In FIG. 7d, the PFET region 64 is then etched back to a thin layer 60, preferably to a thickness on the order of 10 nm. In FIG. 7e, either before or after the mask 44 is removed, a layer of second semiconductor material 46 is disposed over the thin layer 60. As shown in FIG. 7e, the thin layer 60 includes a horizontal surface 67, and a substantially vertical surface 68.

Preferably, the second semiconductor material 46 is SiGe of a moderate concentration. For thermally stable fins, 10%–20% Ge concentration is preferable when the thickness of the layer 46 is between about 10–30 nm. It has been found that thicker layers 46 of SiGe, and/or higher concentrations of Ge, will be metastable and may require further thermal processing, though not annealing. Any embodiment of the present invention preferably includes an enveloping layer of gate dielectric or gate oxide. A channel 16 according to the present invention may be part of a FinFET 10, as in FIG. 3, and the FinFET 10 may preferably be part of an integrated circuit 100. The channel 16 may include a channel core 24 that has substantially upstanding sidewalls 28, 30, a top surface 26, and a bottom surface 27, as in FIG. 4, or may be fabricated to define only a horizontal surface 67 and substantially vertical surfaces 68 as in FIG. 7e. As a further alternative, shown in FIG. 7f, the channel 16 may have two sidewall surfaces 74 that extend from the substrate 22 and join at an acute or rounded peak 71 so as to define a substantially triangular cross section 75, as opposed to the rectangular cross sections illustrated herein, such as the cross section of the thin layer 60. It is anticipated that a channel defining a non-orthogonal cross section would be optimized using strained silicon on the top and in contact with the gate oxide. The channel envelope 32 may contact any two of the surfaces 26, 27, 28, 30 of the channel core 24, or all such surfaces 26, 28, 30 not contacting the substrate 20. In any embodiment above, a broader surface of the strained lattice structures that carry charge (electrons or holes) is better exposed to the gate 18 as compared to prior art FinFETs, enabling greater control by the gate 18 and more efficient current transport.

FIG. 8 represents various additional embodiments of FinFET structures in accordance with the teachings herein. In the embodiments shown in FIG. 8, the structures include a relaxed Si—Ge layer with an overlying strained Si layer. This combination provides for improved electron-hole mobility.

Figure 8A:
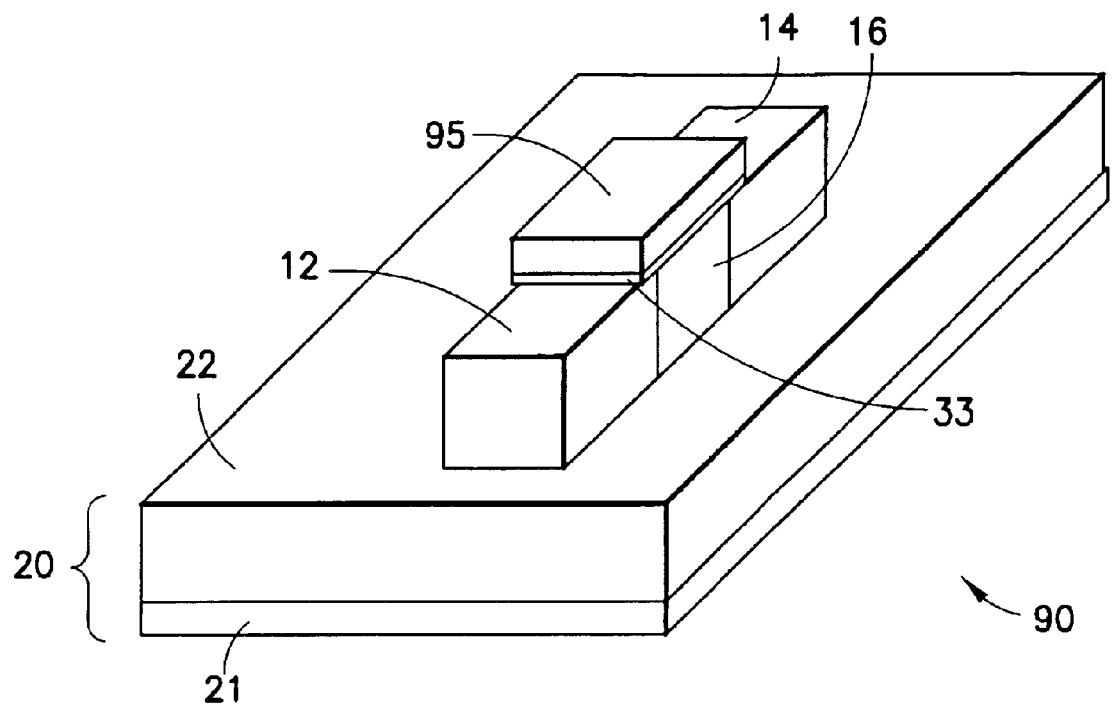
FIGS. 8a–8f, collectively referred to as FIG. 8, are perspective views of various embodiments of FinFET devices.
Figure 8B:
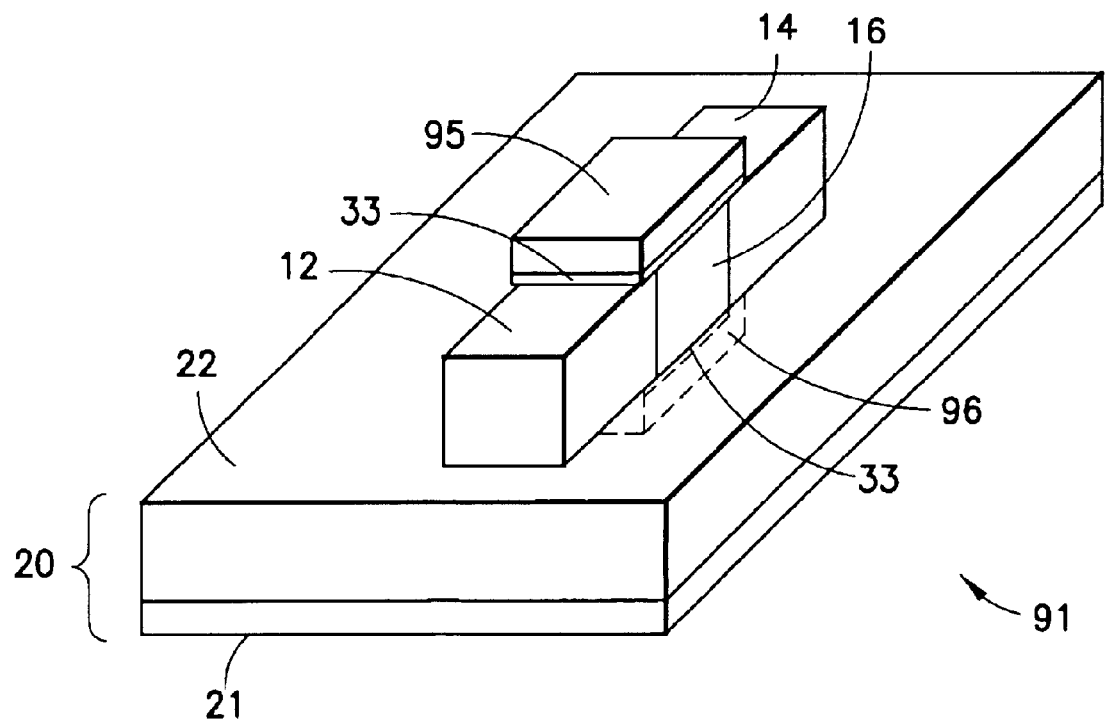

The channel 16 shown in FIGS. 8A–B, is formed of a channel core 24 and is overlain with the channel envelope 32, as is shown in FIG. 4. As shown in FIG. 8, the substrate 20 includes the buried oxide layer 22, and the Si layer 21. Each structure depicted in FIG. 8 includes the source 12, a drain 14, the gate 18, and the channel 16. Also shown is a dielectric layer 33 disposed between the channel 16 and the various gates. As the channel 16 is internal to the structures shown in FIGS. 8C–E, and is therefore not visible, the channel 16 is only depicted in FIGS. 8A–B and 8F. Regardless, each of the embodiments of FIGS. 8A–8F may include the channel core 24 and channel envelope 32 as previously described.

Figure 8C:
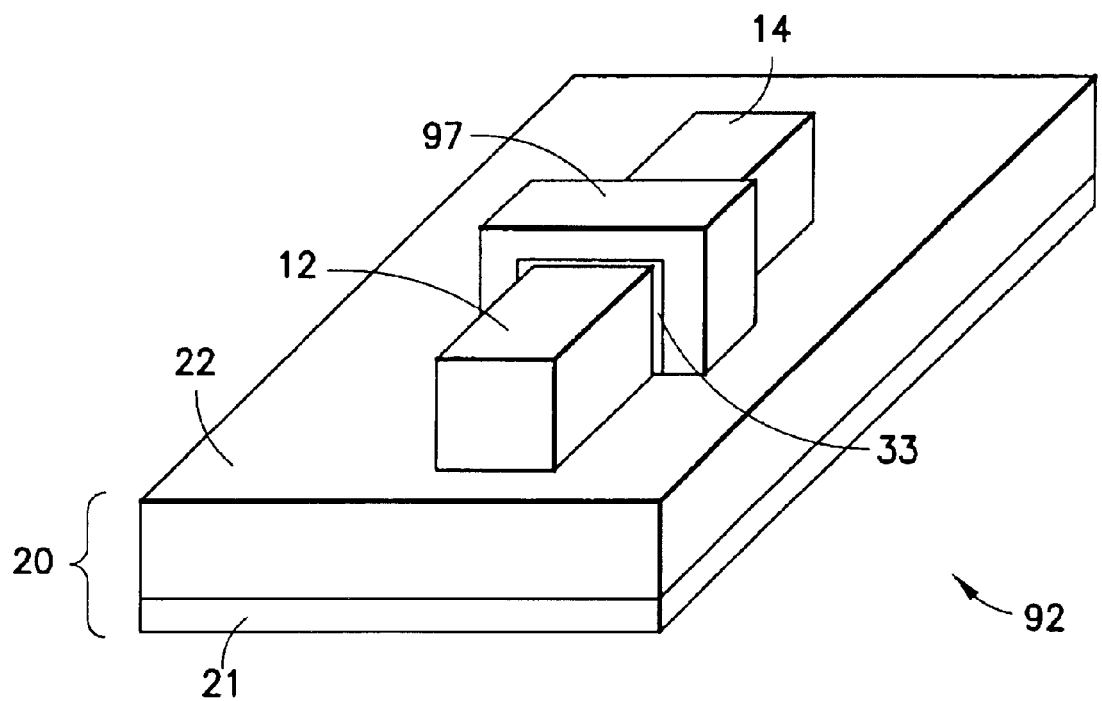
Figure 8D:
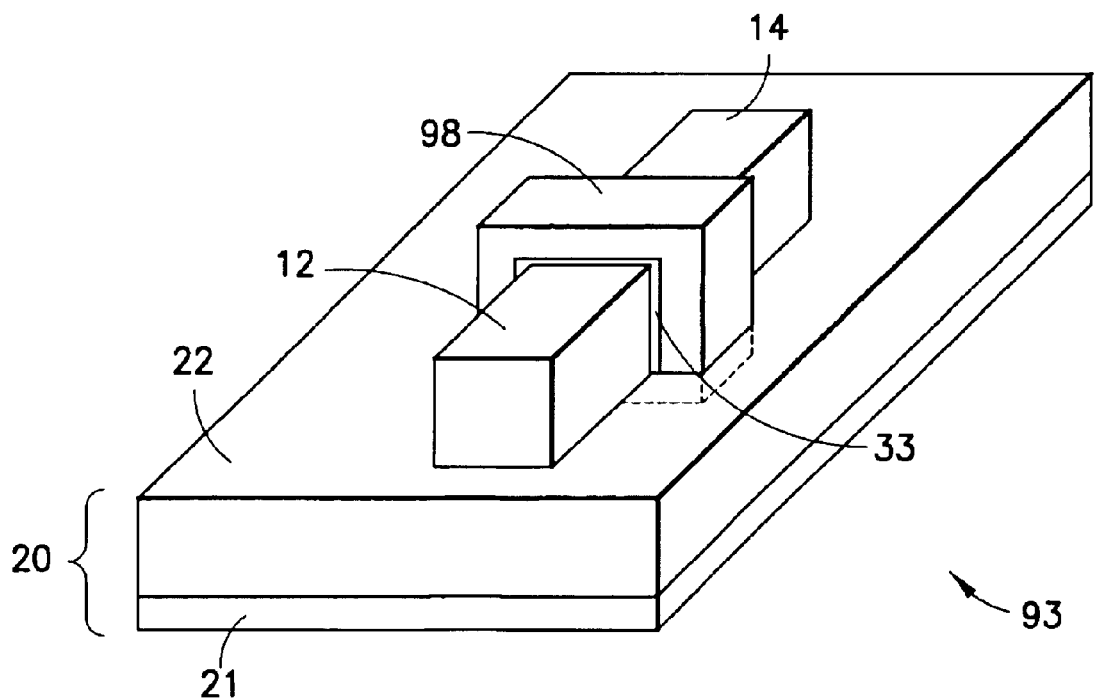
Figure 8E:
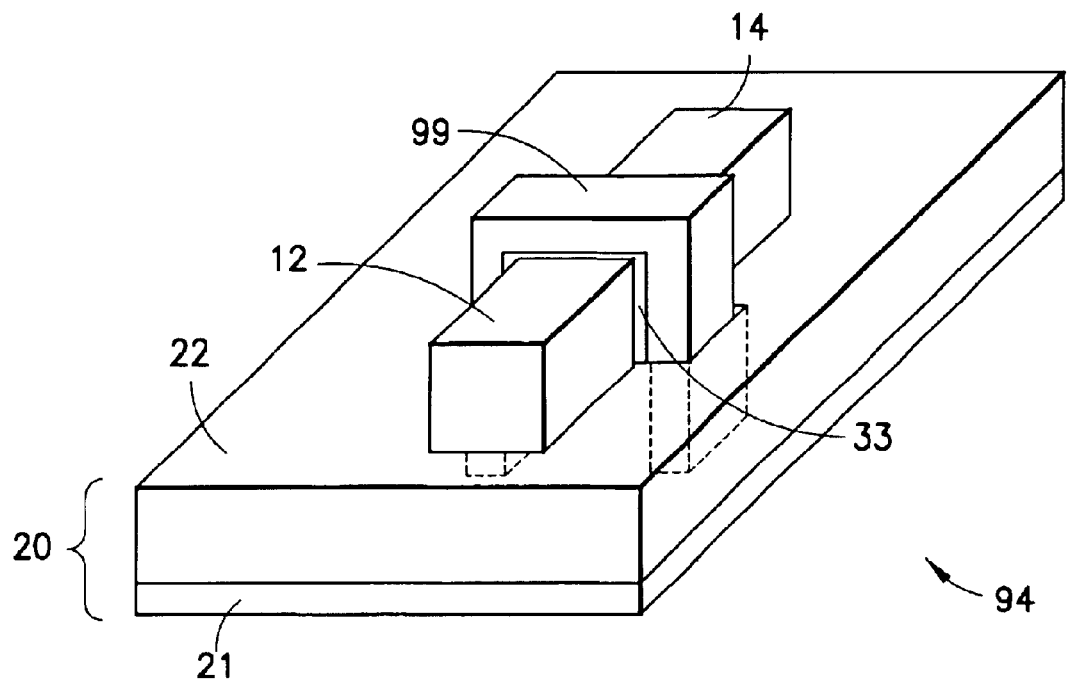

In FIG. 8A, a single gate FinFET 90 is shown. In this embodiment, the channel 16 includes a relaxed Si–Ge layer, and a strained Si layer. A thin oxide layer 33 is disposed between the channel 16 and a single gate 95. FIG. 8B represents a double gate 91 embodiment of a FinFET. In addition to the single gate 95 shown in FIG. 8A, a second gate 96 is presented. In this embodiment, the second gate 96, is buried within a trench in the buried oxide layer 22. FIG. 8C represents a triple gate FinFET 92, wherein a triple gate 97 is formed over the thin oxide layer 33, which is disposed over the channel 16 (shown in FIGS. 8A–B). FIG. 8D represents a quadruple gate FinFET 93, wherein a quadruple gate 98 effectively surrounds the channel 16. In FIG. 8D, a portion of the quadruple gate 98 is submerged in the buried oxide layer 22. In FIG. 8E, a FinFET 94 having a Pi gate 99 is shown. The Pi gate 99 extends downward, and at least partially into the buried oxide layer 22.

Figure 8F:
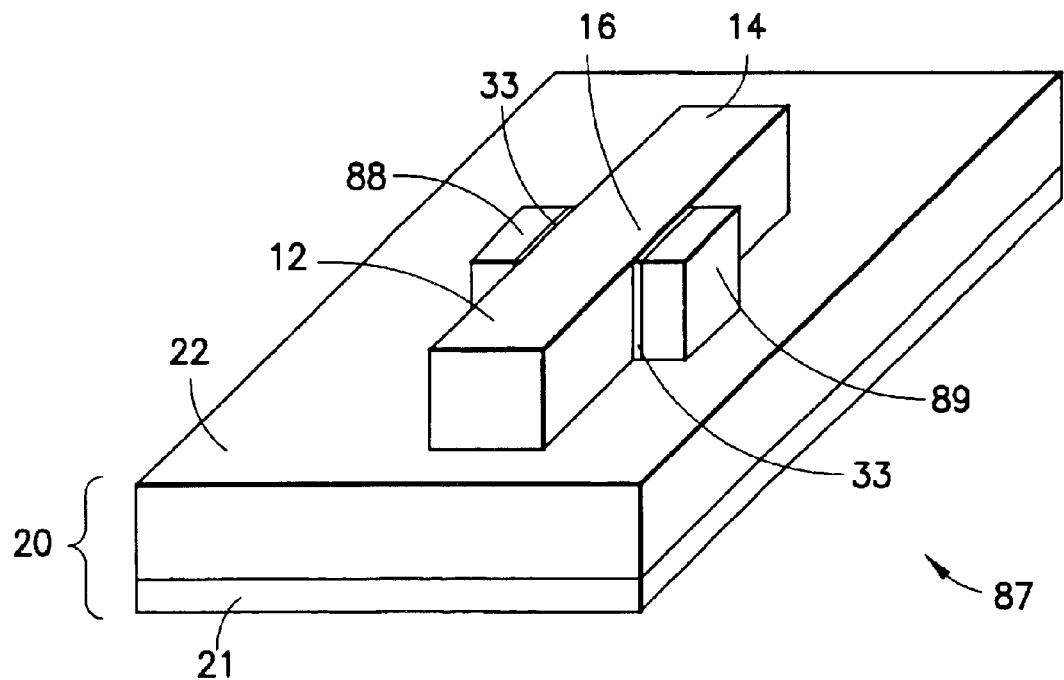

FIG. 8F is another embodiment of a double gate FinFET 87, defining a first gate 88 and a second gate 89. The FinFET of FIG. 8F may be formed, for example, by polishing the FinFET of FIG. 8C until the portion of the triple gate 97 of FIG. 8C that overlies the channel 16 is removed, leaving the two gates 88, 89 of FIG. 8F. Preferably, the channel includes strained silicon germanium. One advantage in the gate arrangement of FIG. 8F is that each gate 88, 89 may be independently controlled so that, for example, the first gate 88 is a typical FinFET gate and the second gate 89 may apply variable voltage. In this manner, the second gate 89 is a back gate to control a depletion region, when current between the source 12 and drain 14 is switched between on and off. Such a second gate 89 better controls leakages and performance of the first gate 88 by use of the variable voltage; so that only the minimum voltage necessary to control leakage current is applied.

Depositing the strained Si layer on the quadruple gate FinFET 93 and the Pi gate FinFET 94, wherein the FinFET 93, 94 are PFET (and not NFET), improves mobility within the PFET, while preserving beneficial aspects of the PFET and the NFET. Further it is noted that depositing strained Si layers in the PFET in the [110] direction also improves the mobility. The [110] direction is at a 45° angle to the crystalline axes.

Figure 9:
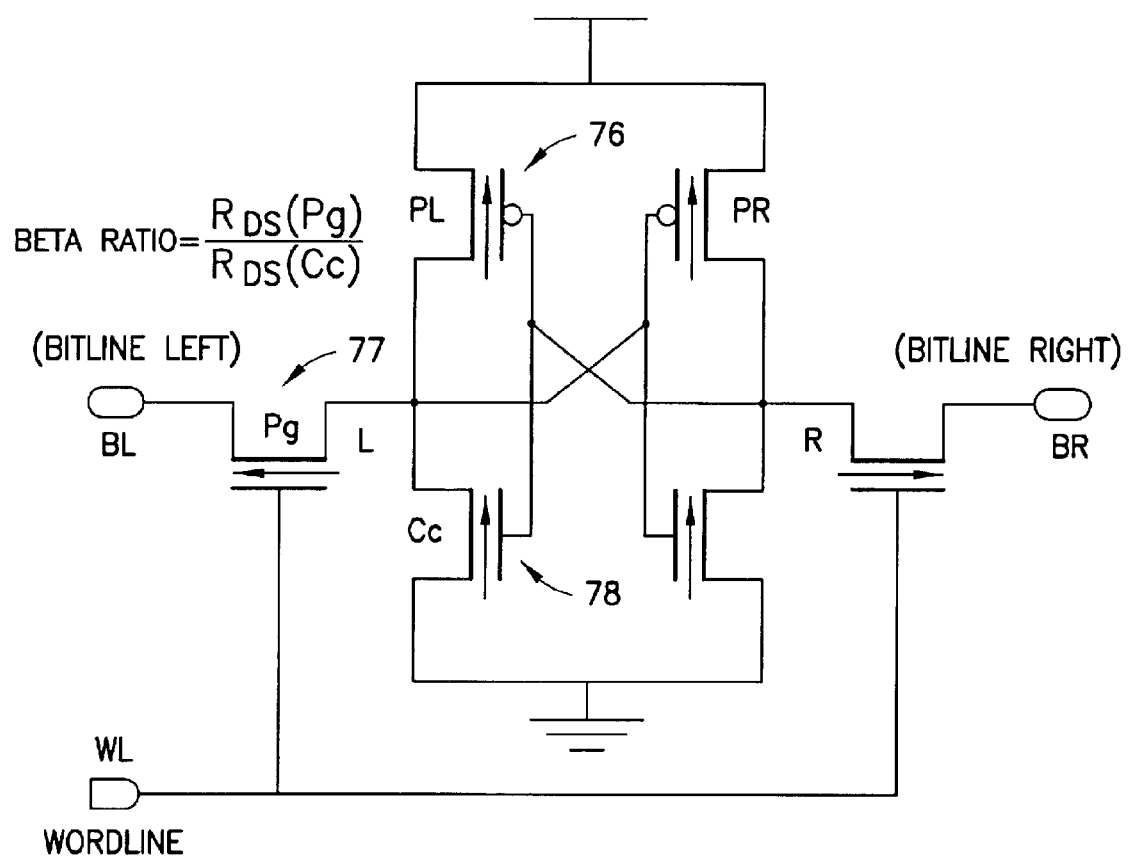
FIG. 9 depicts a SRAM circuit and is useful when discussing quantization.

FIG. 9 depicts one embodiment of a six transistor SRAM unit cell. For SRAM FinFET quantization, preferably, PFET quantization is carried out on the smallest device in a six-transistor conventional SRAM (e.g., NFET pass gate 77 (Pg) and pull-up PFET 76 (PL) is smaller in size). Thus, fin height quantization can be based on individual devices, or bucketing pass gate NFET and pull up PFET into one quanta height and larger NFET 78 (Cc) into another. Alternatively, a smaller fin height, which is employed in multiples of NFET and PFET devices of the embodiment shown in FIGS. 8A–F, may be used. This quantization will help to make a robust and stable cell.

While described in the context of presently preferred embodiments, various modifications of and alterations to the foregoing embodiments can be made with normal skill in the art, and all such modifications and alterations remain within the scope of this invention and the ensuing claims. Examples herein are considered to be illustrative and not exhaustive of the teachings of this invention.

What is claimed is:

1. A channel for electrically connecting a source and a drain of a field effect transistor (FET) comprising:
    a channel core coupled to a substrate and defining a top surface spaced from the substrate and opposed sidewall surfaces between the substrate and the top surface, wherein the channel core comprises a first semiconductor material defining a first lattice structure;
    a channel envelope in contact with the opposed sidewall surfaces and the top surface, wherein the channel envelope comprises a second semiconductor material defining a second lattice structure that differs from the first lattice structure;
    a gate oxide disposed about a surface of the channel envelope that is opposite the channel core.

2. The channel of claim 1 further comprising a gate coupled through the gate oxide to at least two surfaces defined by the channel envelope.

3. The channel of claim 1 wherein at least one of the sidewall surfaces defines a height $h_c$ and the top surface defines a width $w_c$, and wherein $h_c \geq 3 w_c$.

4. The channel of claim 1 wherein the channel is a component of an FET and the FET is a component of a SRAM, and at least one of the sidewall surfaces defines a height $h_c$ that is selected to increase stability of the SRAM.

5. The channel of claim 1 wherein the top surface defines a width w that is selected to maximize one of stretching and of compressing the lattice structure of one of the first and the second semiconductor material.

6. The channel of claim 1 wherein the second semiconductor material substantially covers the two sidewall surfaces and the top surface.

7. The channel of claim 1 wherein one of the first and second semiconductor materials comprises silicon and germanium.

8. In a channel for a field effect transistor, the improvement comprising:
  a channel core defining at least a top and at least one adjoining side surface;
  a channel envelope in contact with the top surface and the at least one side surface;
  a gate oxide disposed on at least two surfaces of the channel envelope, said surfaces of the channel envelope being opposed to the top surface and the at least one side surface;
  wherein the channel core comprises a first semiconductor material and the channel envelope comprises a second semiconductor material, and at least one of the first and second semiconductor materials exhibits one of a stretched and a compressed lattice structure.

9. A field effect transistor (FET) comprising:
  a channel core coupled to a substrate and defining a top surface spaced from the substrate and opposed sidewall surfaces between the substrate and the top surface, wherein the channel core comprises a first semiconductor material defining a first lattice structure;
  a channel envelope in contact with the opposed sidewall surfaces and the top surface, wherein the channel envelope comprises a second semiconductor material defining a second lattice structure that differs from the first lattice structure;
  a gate oxide disposed about a surface of the channel envelope that is opposite the channel core; and
  a gate coupled to the channel core through the gate oxide, said gate disposed at least partially within the substrate.

10. The FET of claim 9 wherein the said gate is a first gate that extends parallel to one of said opposed sidewall surfaces, the FET further comprising a second gate that extends parallel to the other of said sidewall surfaces.

11. The FET of claim 9 wherein each of said first and second gates are disposed only partially within said substrate.

12. The FET of claim 11 further comprising a third gate disposed parallel to the said top surface and electrically coupling the first and second gates.

13. The FET of claim 12 wherein the third gate is not disposed at least partially within said substrate.

14. The FET of claim 9 wherein the said gate is a first gate that extends parallel to said top surface, the FET further comprising a second gate that extends parallel to said top surface and not disposed at least partially within said substrate.

15. The FET of claim 14 further comprising a third and fourth gate each disposed parallel to said opposed sidewalls and each electrically coupling said first and second gates to one another.

16. A field effect transistor (FET) comprising:
  a channel core coupled to a substrate and defining a top surface spaced from the substrate and opposed sidewall surfaces between the substrate and the top surface, wherein the channel core comprises a first semiconductor material defining a first lattice structure;
  a channel envelope in contact with the opposed sidewall surfaces and the top surface, wherein the channel envelope comprises a second semiconductor material defining a second lattice structure that differs from the first lattice structure;
  a gate oxide disposed about a surface of the channel envelope that is opposite the channel core; and
  first and second gates coupled to the channel core through the gate oxide, said first and second gates disposed on opposed sides of said channel core and not directly coupled to one another electrically.

17. The FET of claim 16 wherein said gates are disposed parallel to said top surface.

18. The FET of claim 17 wherein said first gate is at least partially disposed within said substrate.

19. The FET of claim 16 wherein said gates are disposed parallel to said opposed sidewalls.

20. The FET of claim 19 wherein a portion of each of said gates is disposed within said substrate.

21. The FET of claim 16 further comprising a first control coupled to the first gate and a second control for controlling to the second gate, wherein the first and second controls are independent of one another.

22. The FET of claim 21 wherein the first control comprises a first voltage source that applies a variable voltage to the first gate.

23. The FET of claim 22 wherein the second control operates to select between on and off for the second gate, and the first and second controls operate in conjunction with one another.

* * * * *